United States Patent
Park et al.

(10) Patent No.: US 8,293,123 B2
(45) Date of Patent: Oct. 23, 2012

(54) METHOD OF MANUFACTURING INKJET PRINTHEAD AND INKJET PRINTHEAD MANUFACTURED USING THE SAME

(75) Inventors: Jong-jin Park, Yongin-si (KR); Su-min Kim, Ansan-si (KR); Jin-baek Kim, Daejeon (KR); Yong-ung Ha, Suwon-si (KR); Yong-seop Yoon, Seoul (KR); Byung-ha Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1091 days.

(21) Appl. No.: 12/213,767

(22) Filed: Jun. 24, 2008

(65) Prior Publication Data

US 2009/0179000 A1    Jul. 16, 2009

(30) Foreign Application Priority Data

Jan. 10, 2008    (KR) .................. 10-2008-0003061

(51) Int. Cl.
*G01D 15/00*    (2006.01)
(52) U.S. Cl. .......... 216/27; 216/37; 252/79.1; 252/79.2; 252/79.3; 252/79.4; 29/890.1; 430/270.1; 430/192; 430/921; 526/292.5; 526/293; 526/299; 526/307.5
(58) Field of Classification Search ............ 216/27; 252/79.1–79.4; 29/890.1; 430/270.1, 192; 430/921; 526/292.5, 293, 299, 307.5, 312
See application file for complete search history.

(56) References Cited

U.S. PATENT DOCUMENTS

| | | | |
|---|---|---|---|
| 4,705,887 A | 11/1987 | Crivello | |
| 7,419,759 B2 * | 9/2008 | Kim et al. | .................. 430/270.1 |
| 2004/0231780 A1 | 11/2004 | Clark et al. | |
| 2005/0155949 A1 | 7/2005 | Park et al. | |
| 2006/0262157 A1 | 11/2006 | Park et al. | |
| 2007/0256301 A1 * | 11/2007 | Park et al. | ..................... 29/890.1 |
| 2008/0166656 A1 * | 7/2008 | Moon et al. | ................. 430/270.1 |

FOREIGN PATENT DOCUMENTS

| | | |
|---|---|---|
| EP | 0385149 | 9/1990 |
| EP | 0665107 | 8/1995 |
| EP | 1275508 | 1/2003 |
| JP | 01-214843 | 8/1989 |
| WO | 2006/001532 | 1/2006 |

OTHER PUBLICATIONS

Papathomas et al. Journal of Applied Polymer Science, vol. 59, 91996), pp. 2029-2037.*
European Search Report issued Oct. 19, 2009 in EP Application No. 08160801.0.
European Search Report issued Mar. 3, 2010 in EP Application No. 08160801.0.

* cited by examiner

*Primary Examiner* — Nadine G Norton
*Assistant Examiner* — Maki Angadi
(74) *Attorney, Agent, or Firm* — Stanzione & Kim, LLP

(57) ABSTRACT

A method of manufacturing an inkjet printhead, in which a solvent included in a positive photoresist composition or in a non-photosensitive soluble polymer composition which is used to form a sacrificial layer has a different polarity from that of a solvent included in a negative photoresist composition that is used to form at least one of a channel forming layer and a nozzle layer.

17 Claims, 8 Drawing Sheets

METHOD OF MANUFACTURING INKJET PRINTHEAD AND INKJET PRINTHEAD MANUFACTURED USING THE SAME

CROSS-REFERENCE TO RELATED APPLICATIONS

This application claims priority from Korean Patent Application No. 10-2008-0003061, filed on Jan. 10, 2008, in the Korean Intellectual Property Office, the disclosure of which is incorporated herein in its entirety by reference.

BACKGROUND OF THE INVENTION

1. Field of the Invention

The present general inventive concept relates to a method of manufacturing an inkjet printhead, and an inkjet printhead manufactured using the method, and more particularly, to a method of manufacturing an inkjet printhead in which formation of a reaction layer at the bottom of a nozzle layer is prevented, and an inkjet printhead prepared using the method.

2. Description of the Related Art

Inkjet printheads eject tiny droplets of print ink onto a predetermined portion of a to-be-printed sheet so as to produce a predetermined color image, and are categorized into thermal driving type inkjet printheads and piezoelectric driving type inkjet printheads according to an ejection mechanism of ink droplets. As for the thermal driving type inkjet printheads, ink droplets are ejected by an expansion force of bubbles generated when a heat source is applied to the generated bubbles within the ink. As for the piezoelectric driving type inkjet printheads, ink droplets are ejected by a pressure to ink due to a deformation of a piezoelectric device using the device. FIG. 1 is a cross-sectional view of a conventional thermal inkjet printhead.

Referring to FIG. 1, the conventional thermal driving type inkjet printhead includes a substrate 10, a channel forming layer 20 formed on the substrate 10, and a nozzle layer 30 formed on the channel forming layer 20. The substrate 10 has an ink feed hole 51, and the channel forming layer 20 has an ink chamber 53 that can be filled with ink and a restrictor 52 connecting the ink chamber 53 to the ink feed hole 51. The nozzle layer 30 has at least one nozzle 54 through which ink is ejected from the ink chamber 53. On the substrate 10, at least one heater 41 is mounted to heat ink within the ink chamber 53 and at least one electrode 42 is mounted to supply a current to the heater 41.

An ink droplet ejection mechanism of the conventional thermal driving type inkjet printhead will now be described in detail. Ink is fed from an ink container (not illustrated) into the ink chamber 53 through the ink feed hole 51 and the restrictor 52. The ink filled within the ink chamber 53 is then heated by the heater 41 which is formed of a heat-generating resistance and which is located within the ink chamber 53. Once the ink boils, ink generates bubbles, and the generated ink bubbles apply pressure to the ink filled within the ink chamber 53. Therefore, the ink within the ink chamber 53 is ejected through the nozzle 54 to the outside of the ink chamber 53 in the form of droplets.

A conventional inkjet printhead has a protrusion 55, hereinafter referred to as a reaction layer, at the bottom of a nozzle layer, as illustrated in FIGS. 3A and 3B. The reaction layer is formed when a photoresist that is used to form an ink channel is mixed or reacts with a photoresist composition that is used to form a nozzle layer, and degrades the ejection performance of the ink.

SUMMARY OF THE INVENTION

Additional aspects and/or utilities of the present general inventive concept will be set forth in part in the description which follows and, in part, will be obvious from the description, or may be learned by practice of the general inventive concept.

The present general inventive concept provides a method of manufacturing an inkjet printhead, in which a solvent included in a positive photoresist composition or in a non-photosensitive soluble polymer composition which is used to form a sacrificial layer has a different polarity from that of a solvent included in a negative photoresist composition that is used to form at least one of a channel forming layer and a nozzle layer.

A resin included in the positive photoresist composition or in the non-photosensitive soluble polymer composition may include a different polarity from a resin included in the negative photoresist composition.

A difference between dipole moments of the solvent included in the positive photoresist composition or in the non-photosensitive soluble polymer composition and dipole moments of the solvent included in the negative photoresist composition that is used to form at least one of the channel forming layer and the nozzle layer may be about 1.5 Debye or more.

The solvent included in the positive photoresist composition or in the non-photosensitive soluble polymer composition may include a lower polarity than the solvent included in the negative photoresist composition.

A dipole moment of the solvent included in the positive photoresist composition or in the non-photosensitive soluble polymer composition may be about 1 Debye or less.

A dipole moment of the solvent included in the negative photoresist composition may be about 2.5 Debye or more.

A resin included in the positive photoresist composition or in the non-photosensitive soluble polymer composition may include a lower polarity than a resin included in the negative photoresist composition.

A resin included in the positive photoresist composition or in the non-photosensitive soluble polymer composition may be a prepolymer having a bisphenol-A based backbone, represented by Formula 1a:

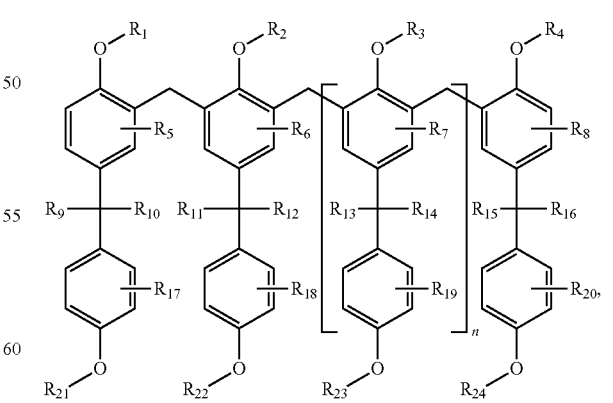

<Formula 1a> where n is an integer ranging from 2 to 10, and $R_1$ to $R_{24}$ are each independently a $C_1$-$C_{20}$ alkyl group, a $C_2$-$C_{20}$ alkenyl group, a $C_2$-$C_{20}$ alkynyl group, a $C_6$-$C_{30}$ aryl group, or a $C_7$-$C_{30}$ arylalkyl group.

A resin included in the positive photoresist composition or in the non-photosensitive soluble polymer composition may be a prepolymer having a bisphenol-A based backbone, represented by Formula 2a:

<Formula 2a>

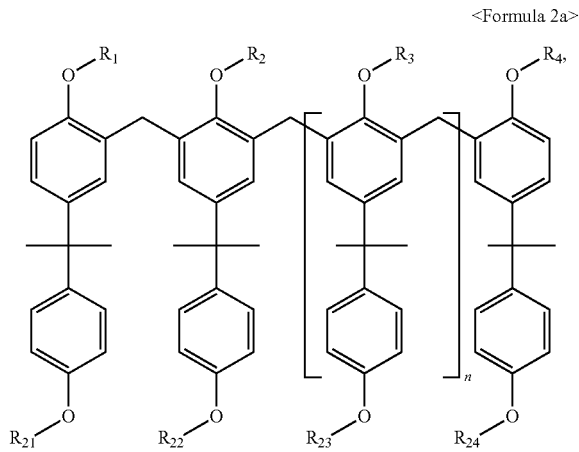

where n is an integer ranging from 2 to 10, and $R_1$ to $R_4$ and $R_{21}$ to $R_{24}$ are each independently a $C_1$-$C_{20}$ alkyl group.

The solvent included in the positive photoresist composition or in the non-photosensitive soluble polymer composition may include a higher polarity than the solvent included in the negative photoresist composition.

A dipole moment of the solvent included in the positive photoresist composition or in the non-photosensitive soluble polymer composition may be about 2.5 Debye or more.

A dipole moment of the solvent included in the negative photoresist composition may be about 1 Debye or less.

A resin included in the positive photoresist composition or in the non-photosensitive soluble polymer composition may include a higher polarity than a resin included in the negative photoresist composition.

A resin included in the positive photoresist composition or in the non-photosensitive soluble polymer composition may be a prepolymer having a bisphenol-A based backbone, represented by Formula 1b:

<Formula 1b>

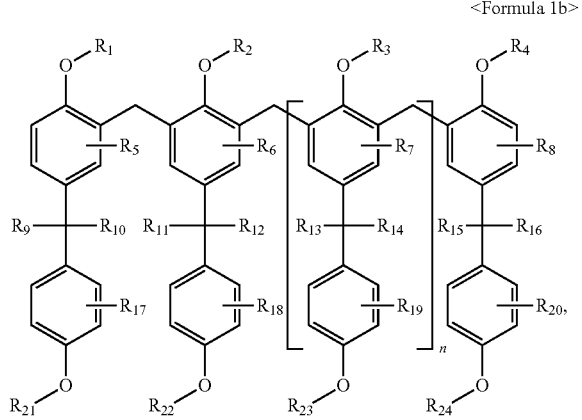

where n is an integer ranging from 2 to 10, and $R_1$ to $R_{24}$ are each independently a halogen atom; a carboxyl group; an amino group; a nitro group; a cyano group; a $C_1$-$C_{20}$ alkyl group substituted with a halogen atom, a carboxyl group, an amino group, a nitro group, or a cyano group; a $C_2$-$C_{20}$ alkenyl group substituted with a halogen atom, a carboxyl group, an amino group, a nitro group, or a cyano group; a $C_2$-$C_{20}$ alkynyl group substituted with a halogen atom, a carboxyl group, an amino group, a nitro group, or a cyano group; a $C_1$-$C_{20}$ heteroalkyl group substituted with a halogen atom, a carboxyl group, an amino group, a nitro group, or a cyano group, or unsubstituted $C_1$-$C_{20}$ heteroalkyl group; a $C_6$-$C_{30}$ aryl group substituted with a halogen atom, a carboxyl group, an amino group, a nitro group, or a cyano group; a $C_7$-$C_{30}$ arylalkyl group substituted with a halogen atom, a carboxyl group, an amino group, a nitro group, or a cyano group; a $C_5$-$C_{30}$ heteroaryl group substituted with a halogen atom, a carboxyl group, an amino group, a nitro group, or a cyano group, or an unsubstituted $C_5$-$C_{30}$ heteroaryl group; or a $C_7$-$C_{30}$ heteroarylalkyl group substituted with a halogen atom, a carboxyl group, an amino group, a nitro group, or a cyano group, or an unsubstituted $C_7$-$C_{30}$ heteroarylalkyl group.

A resin included in the positive photoresist composition or in the non-photosensitive soluble polymer composition may be a prepolymer having a bisphenol-A based backbone, represented by Formula 2b:

<Formula 2b>

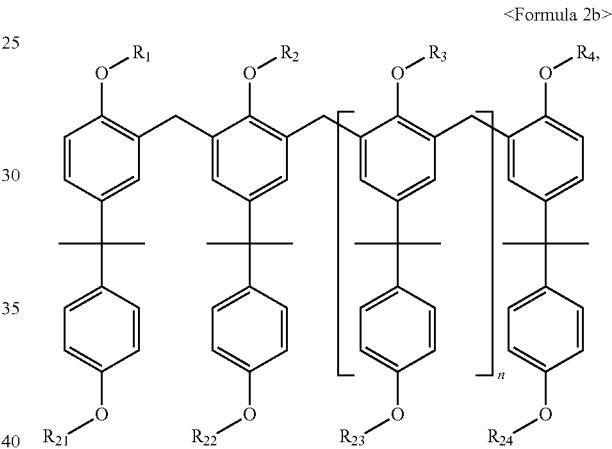

where n is an integer ranging from 2 to 10, and $R_1$ to $R_4$ and $R_{21}$ to $R_{24}$ are each independently a $C_1$-$C_{20}$ alkyl group substituted with a halogen atom.

The solvent included in the positive photoresist composition or in the non-photosensitive soluble polymer composition may include one or more compounds selected from the group consisting of gamma-butyrolactone, propylene glycol methyl ethyl acetate, tetrahydrofurane, methyl ethyl ketone, methyl isobutyl ketone, cyclopentanone and xylene.

A resin included in the negative photoresist composition may be an epoxy-based resin.

The method of manufacturing an inkjet printhead may include disposing a heater for heating an ink and an electrode for supplying a current to the heater on a substrate, disposing a channel forming layer which defines an ink channel by coating a first negative photoresist composition on the substrate on which the heater and the electrode are disposed and then patterning the coated composition using a photolithography process, disposing a sacrificial layer by coating a positive photoresist composition or a non-photosensitive soluble polymer composition on the substrate on which the channel forming layer is disposed such that the coated composition completely covers the channel forming layer, planarizing top surfaces of the channel forming layer and the sacrificial layer using a polishing process, disposing a nozzle layer having a nozzle by coating a second negative photoresist composition on the channel forming layer and the sacrificial layer and patterning the coated composition using a photolithography process, forming an ink feed hole in the substrate, and removing the sacrificial layer.

The polishing process may be a chemical mechanical polishing (CMP) process.

The present general inventive concept also provides an inkjet printhead manufactured using the method of manufacturing the inkjet printhead.

The foregoing and/or other aspects and utilities of the present general inventive concept may be achieved by providing a non-photosensitive soluble polymer composition which includes a prepolymer having a bisphenol-A based backbone represented by Formula 1 and a solvent:

<Formula 1>

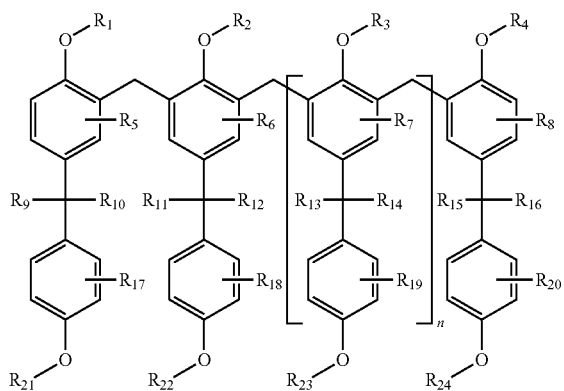

where n is an integer ranging from 2 to 10, and $R_1$ to $R_{24}$ are each independently a halogen atom, a carboxyl group, an amino group, a nitro group, a cyano group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_7$-$C_{30}$ heteroarylalkyl group.

The prepolymer having a bisphenol-A based backbone may be represented by Formula 2:

<Formula 2>

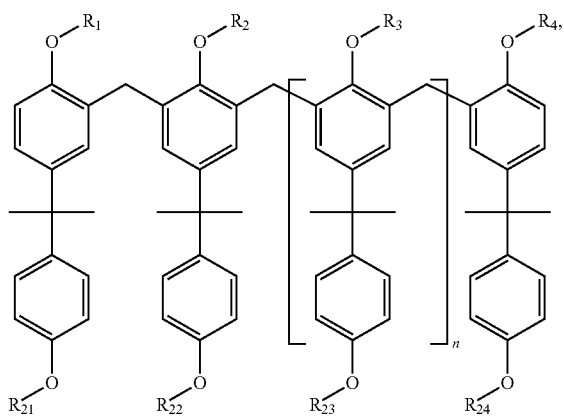

where n is an integer ranging from 2 to 10, and $R_1$ to $R_4$ and $R_{21}$ to $R_{24}$ are each independently a $C_1$-$C_{20}$ alkyl group, or a $C_1$-$C_{20}$ alkyl group substituted with a halogen atom.

A substituent of the $C_1$-$C_{20}$ alkyl group, the $C_2$-$C_{20}$ alkenyl group, the $C_2$-$C_{20}$ alkynyl group, the $C_1$-$C_{20}$ heteroalkyl group, the $C_6$-$C_{30}$ aryl group, the $C_7$-$C_{30}$ arylalkyl group, the $C_5$-$C_{30}$ heteroaryl group, and the $C_3$-$C_{30}$ heteroarylalkyl group may be each independently a halogen atom, a carboxyl group, an amino group, a nitro group, or a cyano group.

The non-photosensitive soluble polymer composition may include about 30 to about 500 parts by weight of the solvent based on 100 parts by weight of the prepolymer having a bisphenol-A based backbone and represented by Formula 1.

The foregoing and/or other aspects and utilities of the present general inventive concept may be achieved by providing a positive photoresist composition which includes a prepolymer having a bisphenol-A based backbone represented by Formula 1, a photosensitive compound, and a solvent:

<Formula 1>

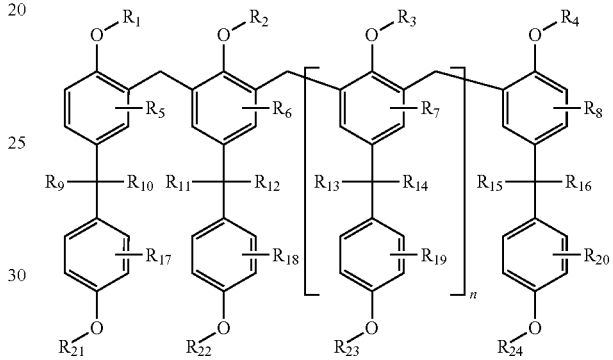

where n is an integer ranging from 2 to 10, and $R_1$ to $R_{24}$ are each independently a halogen atom, a carboxyl group, an amino group, a nitro group, a cyano group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_7$-$C_{30}$ heteroarylalkyl group.

The prepolymer having a bisphenol-A based backbone may be represented by Formula 2:

<Formula 2>

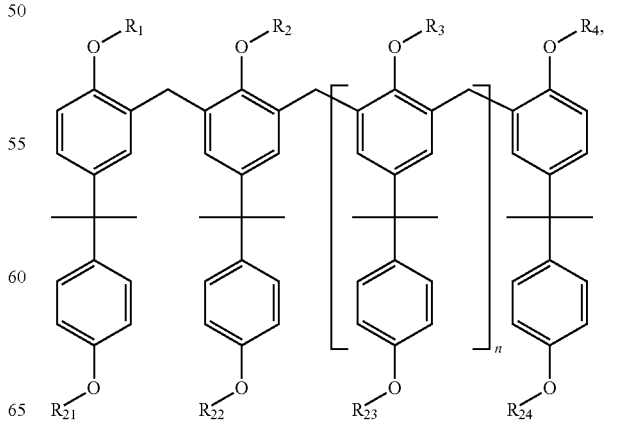

where n is an integer ranging from 2 to 10, and $R_1$ to $R_4$ and $R_{21}$ to $R_{24}$ is each independently a $C_1$-$C_{20}$ alkyl group, or a $C_1$-$C_{20}$ alkyl group substituted with a halogen atom.

A substituent of the $C_1$-$C_{20}$ alkyl group, the $C_2$-$C_{20}$ alkenyl group, the $C_2$-$C_{20}$ alkynyl group, the $C_1$-$C_{20}$ heteroalkyl group, the $C_6$-$C_{30}$ aryl group, the $C_7$-$C_{30}$ arylalkyl group, the $C_5$-$C_{30}$ heteroaryl group, and the $C_3$-$C_{30}$ heteroarylalkyl group may be each independently a halogen atom, a carboxyl group, an amino group, a nitro group, or a cyano group.

The positive photoresist composition may include about 1 to about 80 parts by weight of the photosensitive compound, and about 30 to about 500 parts by weight of the solvent, based on 100 parts by weight of the prepolymer having a bisphenol-A based backbone and represented by Formula 1.

The photosensitive compound may be a photoacid generator (PAG) or quinonediazidesterification products.

BRIEF DESCRIPTION OF THE DRAWINGS

The above and/or other features and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
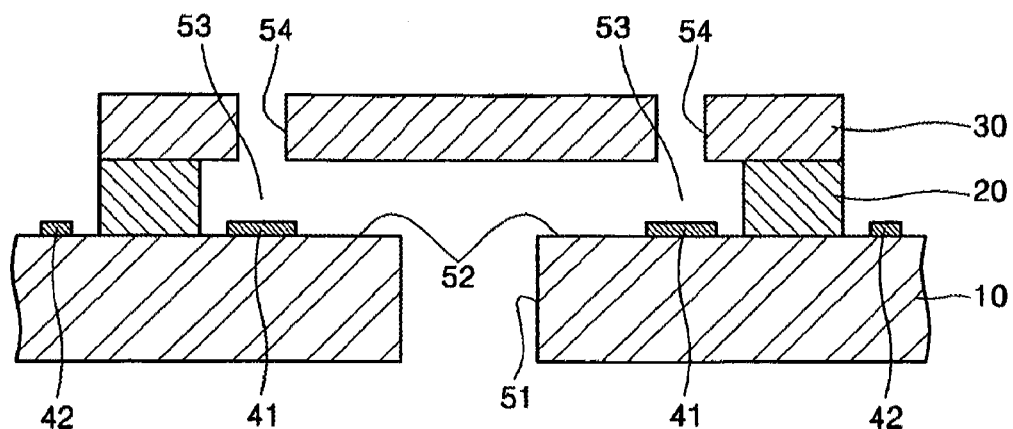
FIG. 1 is a cross-sectional view of a conventional thermal driving type inkjet printhead.

An exemplary embodiment of a method of manufacturing an inkjet printhead and an exemplary embodiment of an inkjet printhead manufactured using the method will now be described more fully with reference to the accompanying drawings, in which exemplary embodiments of the invention are illustrated.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

The general inventive concept of the present application may be embodied in many different forms and should not be construed as being limited to the exemplary embodiments set forth herein; rather, these exemplary embodiments are provided so that this disclosure will be thorough and complete, and will fully convey the general inventive concept of the present invention to those of ordinary skill in the art. In the drawings, the thicknesses of layers and regions are exaggerated for clarity. It will also be understood that when a layer is referred to as being "on" another layer or substrate, it can be directly on the other layer or substrate, or intervening layers may also be present Exemplary embodiments of the present general inventive concept set forth herein will be described based on a thermal driving type inkjet printhead. However, the present general inventive concept may also be applied to a piezoelectric driving type inkjet printhead. Also, the present general inventive concept may also be applied to a monolithic type of inkjet printhead and a contact type of inkjet printhead. The drawings of the present application illustrate only a part of a silicon wafer, and the inkjet printhead according to the present general inventive concept may be manufactured in a form of tens to hundreds of chips on a single wafer.

In the exemplary embodiment of a method of manufacturing an inkjet printhead according to the present general inventive concept, a solvent included in a positive photoresist composition or non-photosensitive soluble polymer composition which is used to form a sacrificial layer may have a different polarity from that of a solvent included in a negative photoresist composition which is used to form a channel forming layer and a nozzle layer. In this regard, the terminology 'soluble' means solubility with respect to a specific solvent.

According to another exemplary embodiment of the present general inventive concept, a resin included in a positive photoresist composition or a non-photosensitive soluble polymer composition has a different polarity from that of a resin included in a negative photoresist composition. In exemplary embodiments, the resin may be a prepolymer, an oligomer, or a polymer. However, the present general inventive concept is not limited thereto. When a resin includes many functional groups having a high polarity, the resin may be a polar polymer, and when a resin only includes functional groups having a low polarity, such as an ether group, the resin may be a relatively non-polar polymer.

When a negative photoresist composition that includes a resin and/or a solvent having a different polarity from a resin and/or solvent included in a composition which is used to form a sacrificial layer that fills an inside of the channel forming layer is used to form a nozzle layer, the sacrificial layer does not react with the nozzle layer. As a result, a reaction layer may not be formed at a bottom of the nozzle layer.

According to another exemplary embodiment of the present general inventive concept, a difference between dipole moments of a resin and/or solvent included in the positive photoresist composition or in the non-photosensitive soluble polymer composition and dipole moments of a resin and/or solvent included in the negative photoresist composition which is used to form the channel forming layer and the nozzle layer may be about 1.5 Debye or more. When the difference is less than 1.5 Debye, the formation of the reaction layer cannot be prevented since the difference in polarity is small. In general, as the dipole moment increases in value, a degree of polarity increases. On the other hand, as the dipole moment decreases in value, a degree of non-polarity decreases. For example, the dipole moment of hydrocarbon, such as pentane, is 0 Debye, and the dipole moment of dimethylketone including a carbonyl group is 2.69 Debye (at 20° C.).

According to another exemplary embodiment of the present general inventive concept, the solvent included in the positive photoresist composition or in the non-photosensitive soluble polymer composition may have a lower polarity than that of the solvent included in the negative photoresist composition. In an exemplary embodiment, the solvent included in the positive photoresist composition or in the non-photo sensitive soluble polymer composition may be xylene (dipole moment of 0.45 Debye), and the solvent included in the negative photoresist composition may be cyclopentanone (dipole moment of 2.7 Debye.) However, the present general inventive concept is not limited thereto.

Specifically, the dipole moment of the solvent included in the positive photoresist composition or in the non-photosensitive soluble polymer composition may be about 1 Debye or less, and specifically, about 0.5 Debye or less. When the dipole moment of the solvent is more than 1 Debye, the solvent may not be suitable as a non-polar solvent. The dipole moment of the solvent included in the negative photoresist composition may be about 2.5 Debye or more, and specifically, about 3.0 Debye or more. When the dipole moment of the solvent is less than 2.5 Debye, the solvent may not suitable as a polar solvent According to another exemplary embodiment of the present general inventive concept, the resin included in the positive photoresist composition or in the non-photosensitive soluble polymer composition may have a lower polarity than that of the resin included in the negative photoresist composition. In an exemplary embodiment, the resin included in the positive photoresist composition or in the non-photosensitive soluble polymer composition may be a non-polar resin and the resin included in the negative photoresist composition may be a polar resin. In exemplary embodiments, the non-polar resin only includes functional groups having a low polarity, and the polar resin includes functional groups having high polarity. In further exemplary embodiments, a functional group having a low polarity may be an ether group, a hydrocarbon group, or the like, and a functional group having a high polarity may be a carbonyl group, an ester group, or the like. However, the present general inventive concept is not limited thereto.

According to another exemplary embodiment of the present general inventive concept, the resin having a low polarity and which is included in the positive photoresist composition or in the non-photosensitive soluble polymer composition may be a prepolymer having a bisphenol-A based backbone represented by Formula 1a:

<Formula 1a>

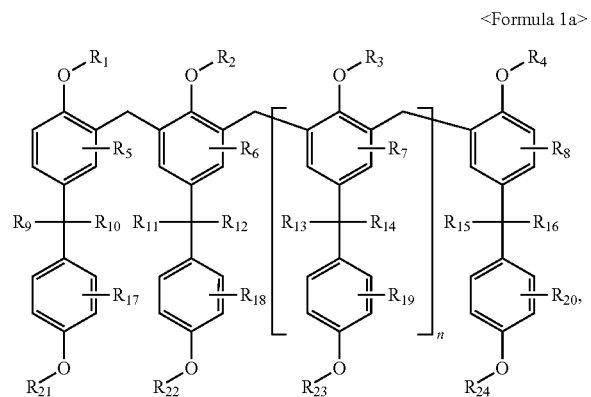

where n is an integer ranging from 2 to 10, and $R_1$ to $R_{24}$ are each independently a $C_1$-$C_{20}$ alkyl group, a $C_2$-$C_{20}$ alkenyl group, a $C_2$-$C_{20}$ alkynyl group, a $C_6$-$C_{30}$ aryl group, or a $C_7$-$C_{30}$ group. However, the present general inventive concept is not limited thereto.

In an exemplary embodiment, such a resin may be a prepolymer having a bisphenol-A based backbone represented by Formula 2a:

<Formula 2a>

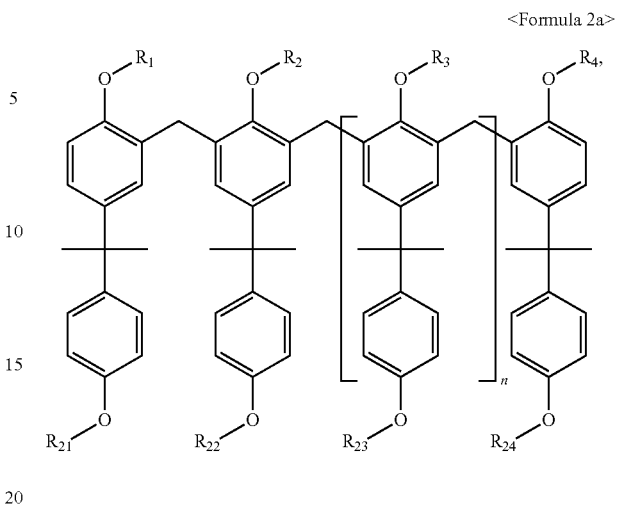

where n is an integer ranging from 2 to 10, and $R_1$ to $R_4$ and $R_{21}$ to $R_{24}$ are each independently a $C_1$-$C_{20}$ alkyl group. However, the present general inventive concept is not limited thereto.

The viscosity of the positive photoresist composition or of the non-photosensitive soluble polymer composition which includes the prepolymer represented by either Formulae 1a or 2a may be about 1500 cps or more, and more specifically, in a range of about 1500 to 3000 cps. In an exemplary embodiment, the viscosity of such compositions may be about 2000 csp. When the viscosity of such compositions is less than 1500 cps, a fill-up process should be performed several times due to such a low viscosity of the compositions and thus the manufacturing costs and time associated therewith may be increased.

According to another exemplary embodiment of the present general inventive concept, the solvent included in the positive photoresist composition or in the non-photosensitive soluble polymer composition may have a higher polarity than that of the solvent included in the negative photoresist composition. In an exemplary embodiment, the solvent included in the photoresist composition or in the non-photosensitive soluble polymer composition may be cyclopentanone (dipole moment of 2.7 Debye) and the solvent included in the negative photoresist composition may be xylene (dipole moment of 0.45 Debye). However, the present general inventive concept is not limited thereto.

Specifically, the dipole moment of the solvent included in the positive photoresist composition or in the non-photosensitive soluble polymer composition may be about 2.5 Debye or more, and more specifically, about 3.0 Debye or more. When the dipole moment of the solvent included in the positive photoresist composition or in the non-photosensitive soluble polymer composition is less than 2.5 Debye, the solvent may not be suitable as a polar solvent. The dipole moment of the solvent included in the negative photoresist composition may be about 1.0 Debye or less, and more specifically, about 0.5 Debye or less. When the dipole moment of the solvent included in the negative photoresist composition is more than 1 Debye, the solvent may not be suitable as a non-polar solvent.

According to another exemplary embodiment of the present general inventive concept, a resin included in the positive photoresist composition or in the non-photosensitive soluble polymer composition may have a higher polarity than that of a resin included in the negative photoresist composition. In an exemplary embodiment, the positive photoresist composition may include a polar resin, and the negative photoresist composition may include a non-polar resin. However, the present general inventive concept is not limited thereto.

According to another exemplary embodiment of the present general inventive concept, the resin having a high polarity and included in the positive photoresist composition or in the non-photosensitive soluble polymer composition may be a prepolymer having a bisphenol-A based backbone represented by Formula 1b:

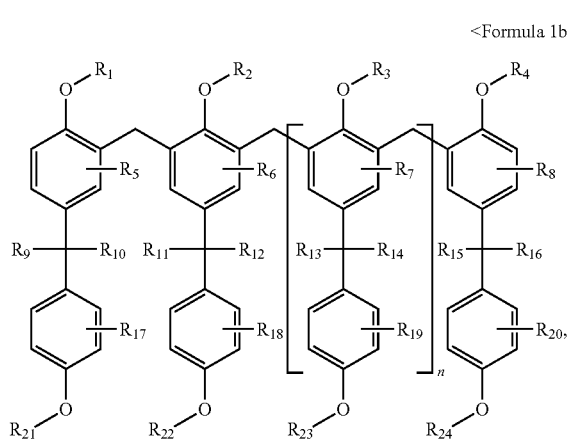

<Formula 1b> where n is an integer ranging from 2 to 10, and $R_1$ to $R_{24}$ are each independently a halogen atom; a carboxyl group; an amino group; a nitro group; a cyano group; a $C_1$-$C_{20}$ alkyl group substituted with a halogen atom, a carboxyl group, an amino group, a nitro group, or a cyano group; a $C_2$-$C_{20}$ alkenyl group substituted with a halogen atom, a carboxyl group, an amino group, a nitro group, or a cyano group; a $C_2$-$C_{20}$ alkynyl group substituted with a halogen atom, a carboxyl group, an amino group, a nitro group, or a cyano group; a $C_1$-$C_{20}$ heteroalkyl group substituted with a halogen atom, a carboxyl group, an amino group, a nitro group, or a cyano group, or unsubstituted $C_1$-$C_{20}$ heteroalkyl group; a $C_6$-$C_{30}$ aryl group substituted with a halogen atom, a carboxyl group, an amino group, a nitro group, or a cyano group; a $C_7$-$C_{30}$ arylalkyl group substituted with a halogen atom, a carboxyl group, an amino group, a nitro group, or a cyano group; a $C_5$-$C_{30}$ heteroaryl group substituted with a halogen atom, a carboxyl group, an amino group, a nitro group, or a cyano group, or an unsubstituted $C_5$-$C_{30}$ heteroaryl group; or a $C_7$-$C_{30}$ heteroarylalkyl group substituted with a halogen atom, a carboxyl group, an amino group, a nitro group, or a cyano group, or an unsubstituted $C_7$-$C_{30}$ heteroarylalkyl group. However, the present general inventive concept is not limited thereto.

In an exemplary embodiment, such a resin may be a prepolymer having a bisphenol-A based backbone and represented by Formula 2b:

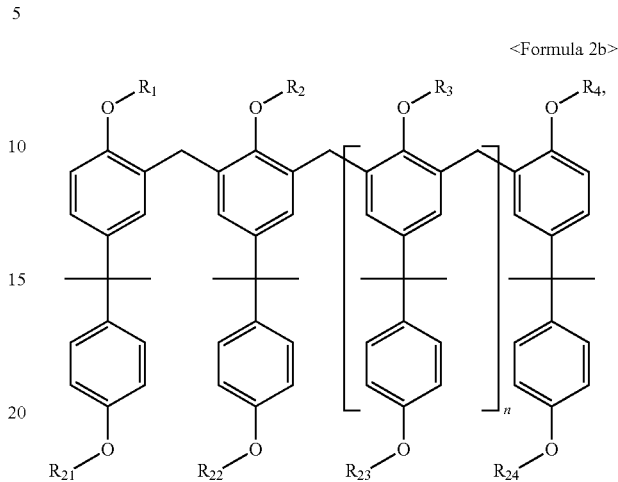

<Formula 2b> where n is an integer ranging from 2 to 10, and $R_1$ to $R_4$ and $R_{21}$ to $R_{24}$ are each independently a $C_1$-$C_{20}$ alkyl group substituted with a halogen atom. However, the present general inventive concept is not limited thereto.

The viscosity of the positive photoresist composition or of the non-photosensitive soluble polymer composition which includes the prepolymer represented by either Formulae 1b or 2b may be about 1500 cps or more, and more specifically, in a range of about 1500 to about 3000 cps. In an exemplary embodiment, the viscosity of such compositions may be about 2000 csp. When the viscosity of such compositions is less than 1500 cps, a fill-up process should be performed several times due to such a low viscosity of the compositions and thus the manufacturing costs and time associated therewith may be increased.

According to another exemplary embodiment of the present general inventive concept, a solvent that is used in the positive photoresist composition or in the non-photosensitive soluble polymer composition may be gamma-butyrolactone, propylene glycol methyl ethyl acetate, tetrahydrofurane, methyl ethyl ketone, methyl isobutyl ketone, cyclopentanone, xylene and/or a mixture thereof. However, the present general inventive concept is not limited thereto. In an exemplary embodiment, the solvent may be any solvent that is used or conventionally known in the art. When the positive photoresist composition or the non-photosensitive soluble polymer composition has a higher polarity than that of the negative photoresist composition, the positive photoresist composition or the non-photosensitive soluble polymer composition may use a solvent having a large dipole moment value. On the other hand, when the positive photoresist composition or the non-photosensitive soluble polymer composition has a lower polarity than that of the negative photoresist composition, the positive photoresist composition or the non-photosensitive soluble polymer composition may use a solvent having a small dipole moment value. However, the present general inventive concept is not limited thereto.

According to another exemplary embodiment of the present general inventive concept, a resin included in the negative photoresist composition may be an epoxy-based resin. However, the type of the resin may not be limited to the epoxy-based resin, and therefore can be any resin that is used in a negative photoresist composition or conventionally known in the art.

An exemplary embodiment of a method of manufacturing the inkjet printhead according to the present general inventive concept includes forming a heater for heating an ink and an electrode for supplying a current to the heater which is disposed on a substrate, forming a channel forming layer defining an ink channel by coating a first negative photoresist composition on the substrate on which the heater and the electrode are formed and then patterning the coated composition using a photolithography process, forming a sacrificial layer by coating a positive photoresist composition or a non-photosensitive soluble polymer composition on the substrate on which the channel forming layer is formed such that the coated composition completely covers the channel forming layer, planarizing top surfaces of the channel forming layer and the sacrificial layer by using a polishing process, forming a nozzle layer having a nozzle by coating a second negative photoresist composition on the channel forming layer and the sacrificial layer and patterning the coated composition using a photolithography process, forming an ink feed hole in the substrate, and removing the sacrificial layer.

In an exemplary embodiment of the method, the substrate may be a silicon wafer, and the forming of a channel forming layer may include completely coating a first negative photoresist composition on the surface of the substrate to form a first photoresist layer, exposing the first photoresist layer using a first photomask having an ink channel pattern, and developing the first photoresist layer to remove the unexposed portion of the first photoresist layer so as to form the channel forming layer.

In an exemplary embodiment of the method of forming of the sacrificial layer, the sacrificial layer is formed to a thickness larger than a thickness of the channel forming layer. In an exemplary embodiment, the sacrificial layer may be formed using a spin coating process. However, the present general inventive concept is not limited thereto.

In an exemplary embodiment of the method of planarizing, top portions of the channel forming layer and the sacrificial layer are planarized using a polishing process until the ink channel has a predetermined height. In an exemplary embodiment, the polishing process may be a chemical-mechanical-polishing (CMP) process. However, the present general inventive concept is not limited thereto.

In an exemplary embodiment, the method of forming a nozzle layer may include coating the second negative photoresist composition on the channel forming layer and the sacrificial layer to form a second photoresist layer, exposing the second photoresist layer using a second photomask having a nozzle pattern, and developing the second photoresist layer to remove unexposed portions of the second photoresist layer so as to form a nozzle and a nozzle layer. In an exemplary embodiment, the forming of an ink feed hole may include coating photoresist on a bottom surface of the substrate, patterning the photoresist to form an etch mask for forming the ink feed hole, and etching portions of the bottom surface of the substrate that are exposed through the etch mask to form the ink feed hole. In this regard, the bottom surface of the substrate may be etched using a dry etching method using plasma or a wet etching method using tetramethyl ammnonium hydroxide (TMAH) or KOH as an etchant. However, the present general inventive concept is not limited thereto.

In exemplary embodiments, the first and second negative photoresist compositions may include, in addition to an acrylate-based resin, a variety of resins. In an exemplary embodiment, the first and second negative photoresist compositions may further include, in addition to the resin, a cationic photo initiator and a solvent. However, the present general inventive concept is not limited thereto.

In an exemplary embodiment, the resin included in the negative photoresist composition may be cross-linked when exposed to actinic radiation, such as ultraviolet (UV) radiation.

According to the present general inventive concept, a top surface of a sacrificial layer may be planarized, thereby allowing the shape and dimensions of an ink channel to be easily controlled, and thus, the uniformity of the ink channel can be improved.

FIGS. 2A through 2I are cross-sectional views illustrating a method of manufacturing an inkjet printhead according to an exemplary embodiment of the present general inventive concept in which a channel forming layer 120 and a nozzle layer 130 are formed and a sacrificial layer S is planarized by using a CMP process. However, the present general inventive concept is not limited thereto. That is, the sacrificial layer S may be planarized by using a process conventionally known or used in the art.

Figure 2A:
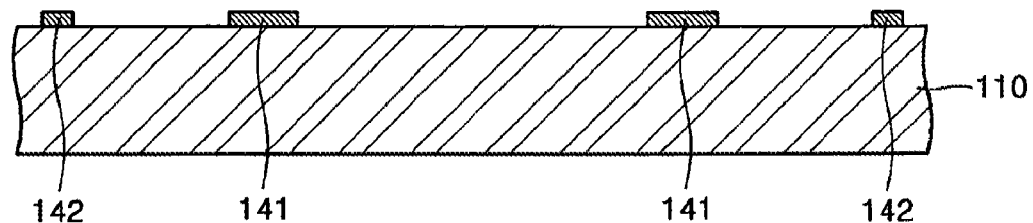
FIGS. 2A-2L are cross-sectional views illustrating a method of manufacturing an inkjet printhead according to an exemplary embodiment of the present general inventive concept.

First, referring to FIG. 2A, at least one heater 141 for heating the ink, and at least one electrode 142 for supplying a current to the heater 141 are formed on a substrate 110. In an exemplary embodiment, the substrate 110 may be a silicon wafer that is generally used in processes of manufacturing a semiconductor device, and is effective for mass production systems.

Specifically, the heater 141 is formed by depositing a heat-generating resistance, such as a tantalum-nitride alloy or a tantalum-aluminum alloy, on the substrate 110 by using a sputtering method or a chemical vapor deposition method, and then patterning the deposited material. However, the present general inventive concept is not limited thereto.

The electrode 142 is formed by depositing a conductive metal, such as aluminum or aluminum alloy, on the substrate 110 by using a sputtering method and then patterning the deposited material. In addition, although not illustrated, a protective layer formed of silicon oxide or a silicon nitride may be formed on the heater 141 and on the electrode 142. However, the present general inventive concept is not limited thereto.

Figure 2B:
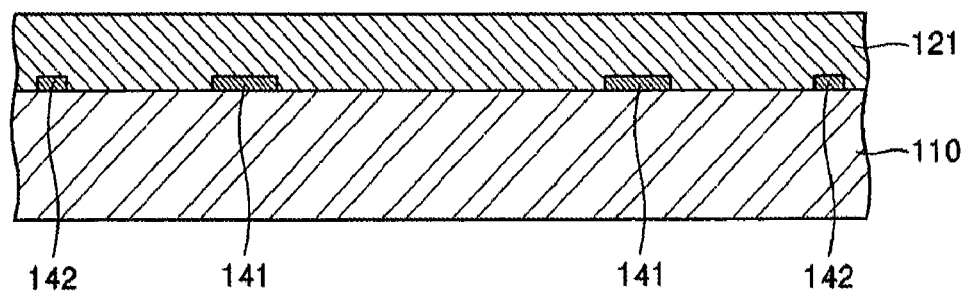

Then, referring to FIG. 2B, a first negative photoresist layer 121 is formed on the substrate 110 on which the heater 141 and the electrode 142 are formed or disposed. In an exemplary embodiment, the first negative photoresist layer 121 may be used to form the channel forming layer 120 (refer to FIG. 2D) which surrounds an ink chamber 153 and a restrictor 152, as will be described in detail later. The first negative photoresist layer 121 is cross-linked when exposed to actinic radiation, such as UV radiation, and thus, the first negative photoresist layer 121 is chemically stabilized with respect to the ink. The first negative photoresist layer 121 may be formed using a negative photoresist composition including a solvent and/or resin having a high or a low polarity, which has been described above. Specifically, the first negative photoresist layer 121 is formed by completely coating the negative photoresist composition including a solvent and/or resin having a high or a low polarity on the surface of substrate 110 to a predetermined thickness using a spin coating method. However, the present general inventive concept is not limited thereto.

Figure 2C:
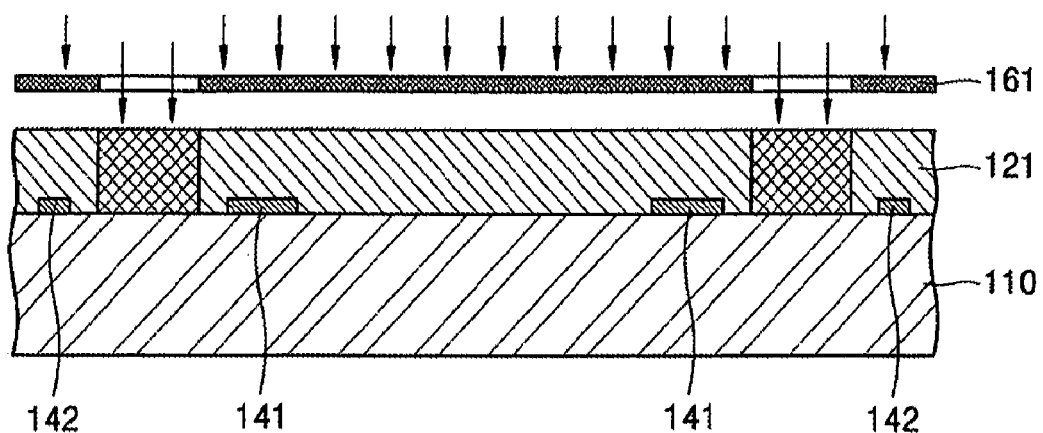

Then, referring to FIG. 2C, the first negative photoresist layer 121 is exposed to actinic radiation, such as UV radiation, using a first photomask 161 which has an ink chamber pattern and a restrictor pattern. In the exposing process, a portion of the first negative photoresist layer 121 that is exposed to UV radiation is hardened and thus has chemical durability and a high mechanical strength, on the other hand, a portion of the first negative photoresist layer 121 that is not exposed to UV radiation is easily dissolved by a developer.

Figure 2D:
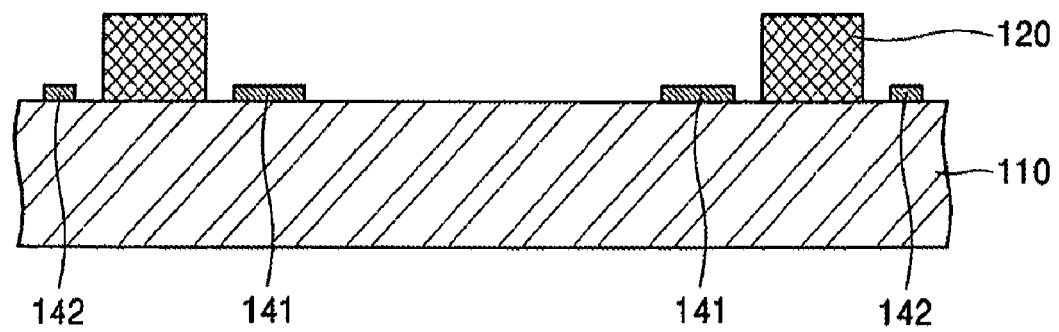

Then, the first negative photoresist layer 121 is developed in order to remove the unexposed portion of the first negative photoresist layer 121 so as to form the channel forming layer 120 defining an ink channel, as illustrated in FIG. 2D.

Figure 2E:
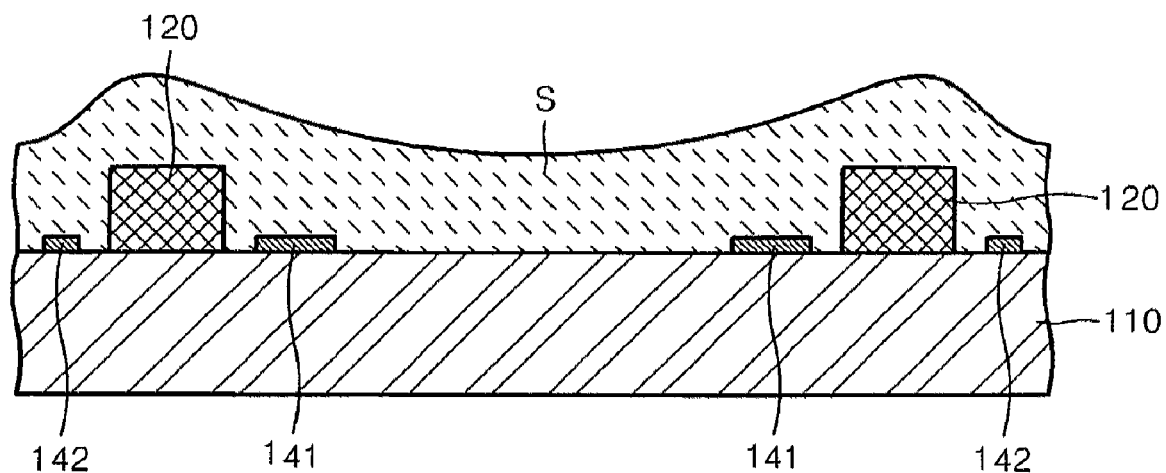

Then, referring to FIG. 2E, a sacrificial layer S is formed on the substrate 110 such that the sacrificial layer S covers the channel forming layer 120. As described above, in an exemplary embodiment, the sacrificial layer S may be formed using a positive photoresist composition or the non-photosensitive soluble polymer composition which includes a solvent and/or resin having a different polarity from that of the negative photoresist composition. In this regard, the sacrificial layer S may be formed to have a greater thickness than the channel forming layer 120, and may be formed by spin-coating a positive photoresist composition or the non-photosensitive soluble polymer composition on the substrate 110 to a predetermined thickness, and then baking the coated film.

Figure 2F:
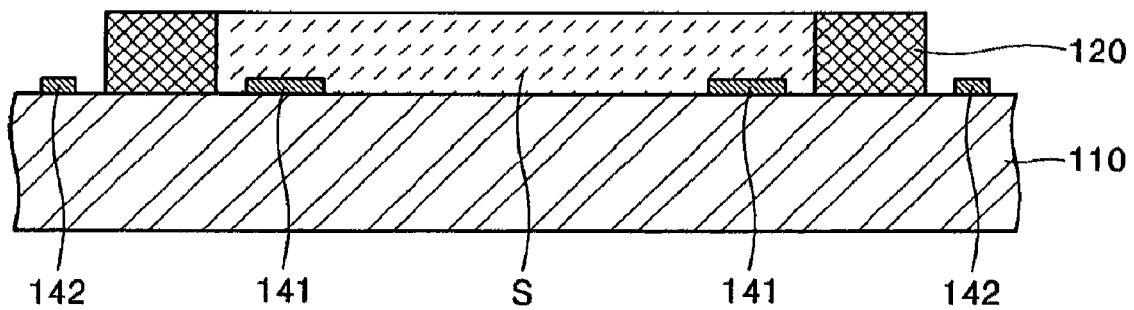
Figure 2G:
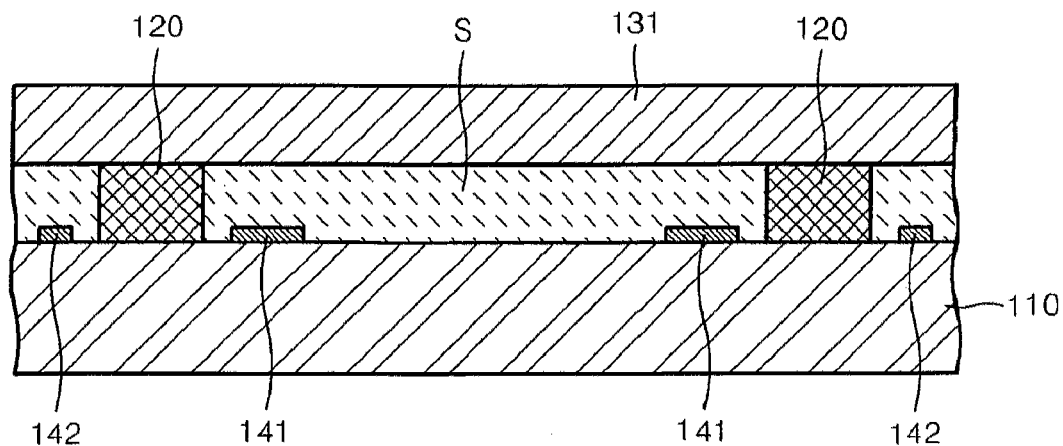

Then, referring to FIG. 2F, top portions of the channel forming layer 120 and the sacrificial layer S are planarized by CMP. Specifically, top portions of the sacrificial layer S and the channel forming layer 120 are polished by CMP until the ink channel has a predetermined height, and thus, the channel forming layer 120 and the sacrificial layer S have a same thickness. However, the present general inventive concept is not limited thereto. Then, referring to FIG. 2G, a second negative photoresist layer 131 is formed on the planarized top surfaces of the channel forming layer 120 and the sacrificial layer S. In an exemplary embodiment, the second negative photoresist layer 131 may be formed using a composition that includes a solvent and a resin which has a same polarity as the solvent and the resin included in the composition used to form the first negative photoresist layer 121.

The second negative photoresist layer 131 is for forming the nozzle layer 130 (refer to FIG. 2I), as described in more detail later. The second negative photoresist layer 131 is cross-linked when exposed to actinic radiation, such as UV radiation, and thus becomes chemically stabilized with respect to the ink. Specifically, the second negative photoresist layer 131 is formed by coating the negative photoresist composition including a solvent and/or resin having a high or a low polarity on the channel forming layer 120 and the sacrificial layer S to a predetermined thickness by using a spin coating method. In this regard, the second negative photoresist layer 131 may be formed to such thickness that the depth of a nozzle 154 is sufficient and the second negative photoresist layer 131 can endure a change in pressure in the ink chamber.

In addition, since the top surfaces of the sacrificial layer S and the channel forming layer 120 are planarized to be flush with each other in the previous process, deformation or melting of an edge portion of the sacrificial layer S due to a reaction between a material forming the second negative photoresist layer 131 and the material forming the sacrificial layer S may not occur. Therefore, in exemplary embodiments, the second photoresist layer 131 may closely contact the top surface of the channel forming layer 120.

Figure 2H:
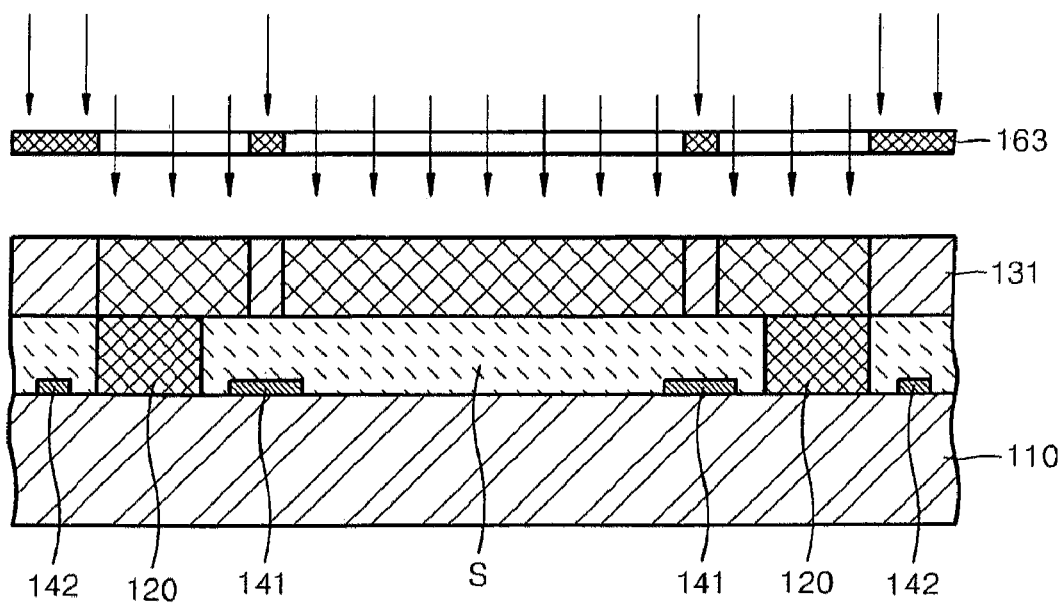
Figure 2I:
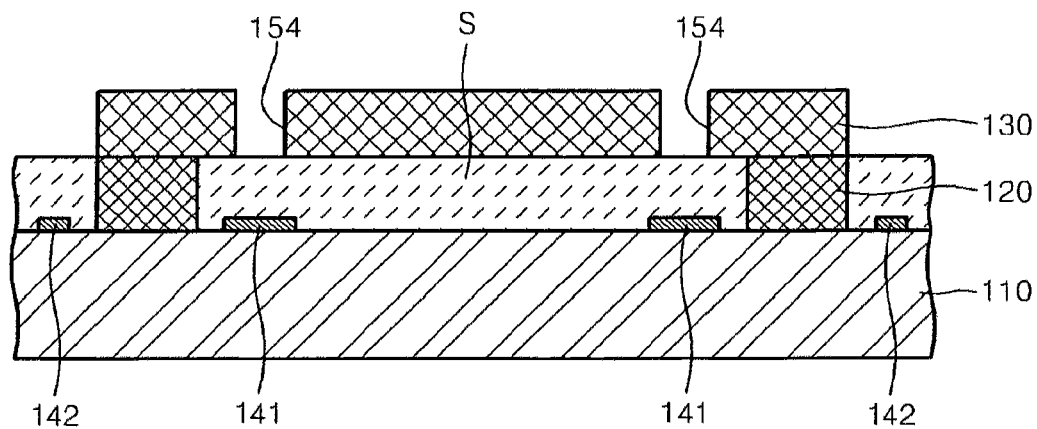

Then, referring to FIG. 2H, the second negative photoresist layer 131 is exposed using a second photomask 163 having a nozzle pattern. Then, the second negative photoresist layer 131 is developed such that a non-exposed portion of the second negative photoresist layer 131 is removed in order to form the nozzle 154 as illustrated in FIG. 2I, and a portion that is exposed hardens and remains as the nozzle layer 130. In this regard, a reaction layer may not be formed at an interface between the second negative photoresist layer 131 and the sacrificial layer S because they have a different polarity. Then, referring to FIG. 2J, an etch mask 171 for forming an ink feed hole (151 of FIG. 2K) is formed on a bottom surface of the substrate 110. In an exemplary embodiment, the etch mask 171 may be formed by coating a positive or negative photoresist on the bottom surface of the substrate 110 and then patterning the resultant photoresist into the etch mask 171.

Figure 2J:
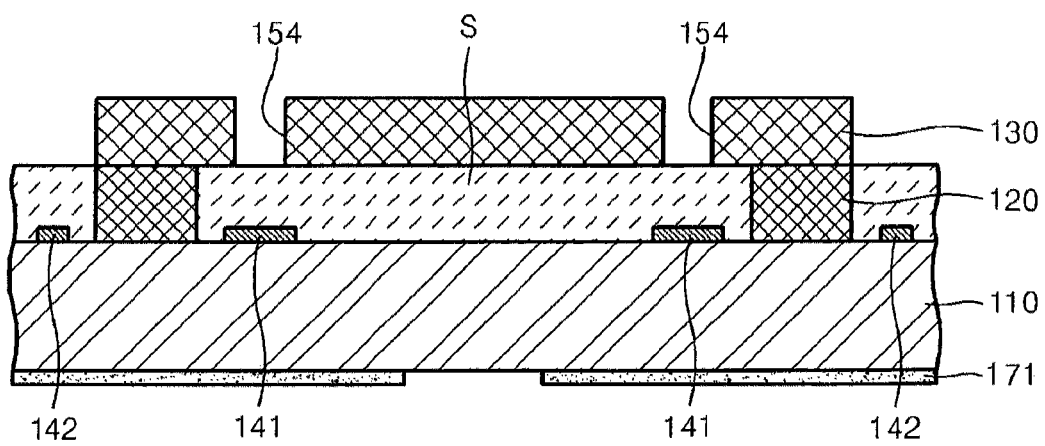
Figure 2K:
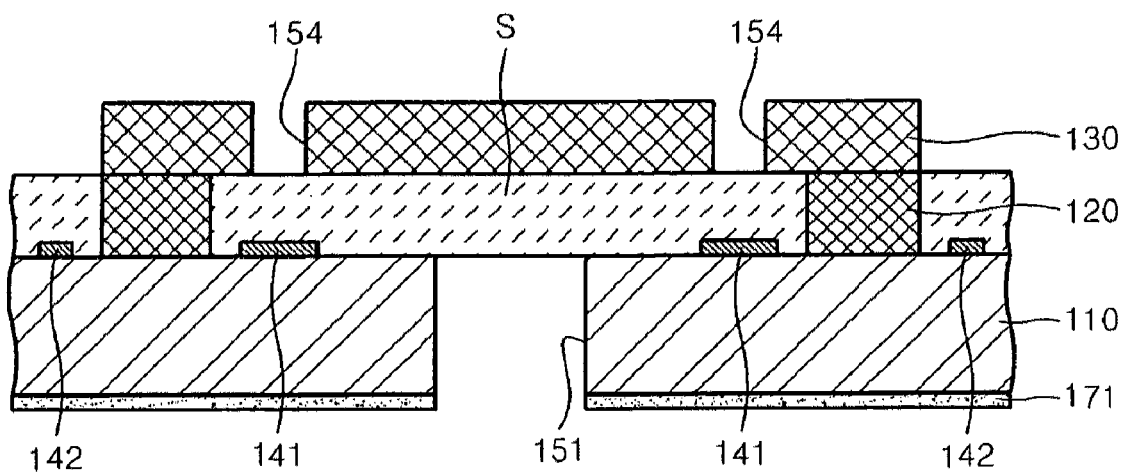
Figure 2L:
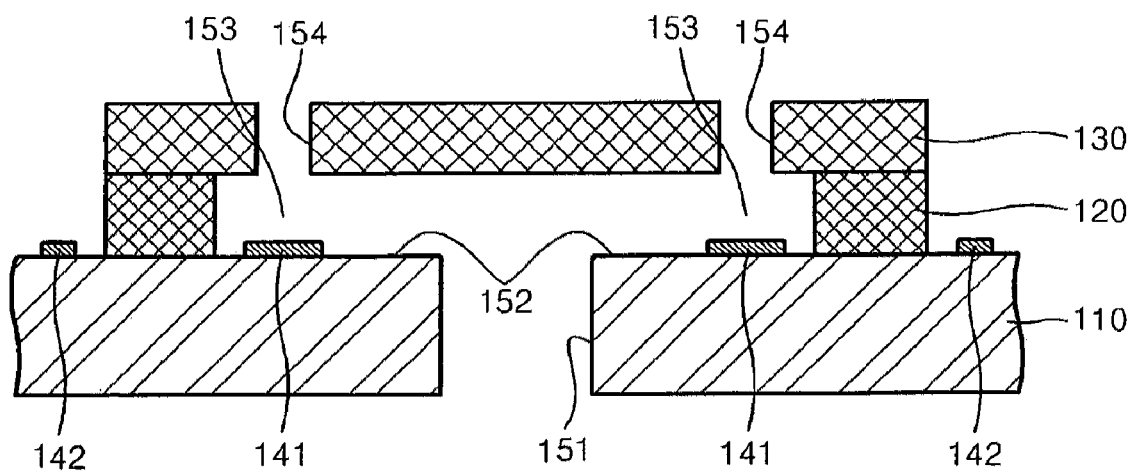
Figure 3A:
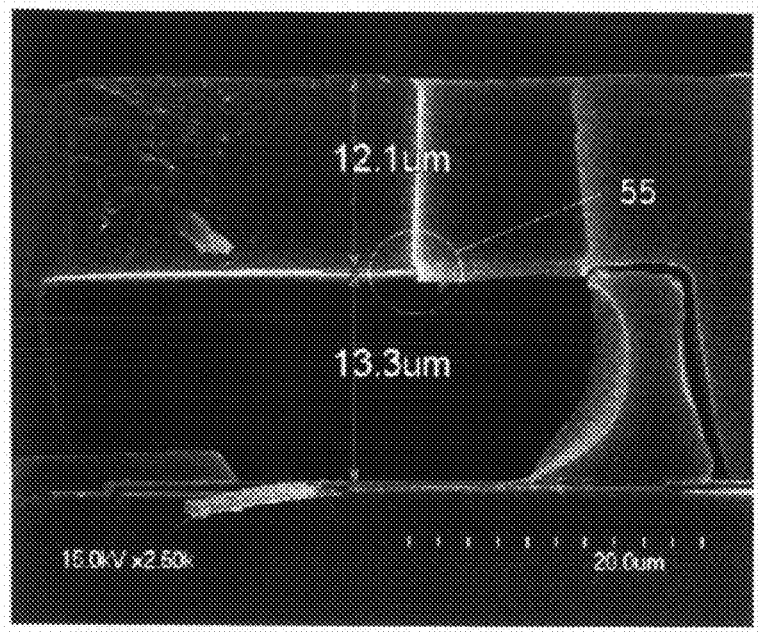
FIGS. 3A and 3B illustrate scanning electron microscopic (SEM) images of a nozzle layer of a conventional inkjet printhead.
Figure 3B:
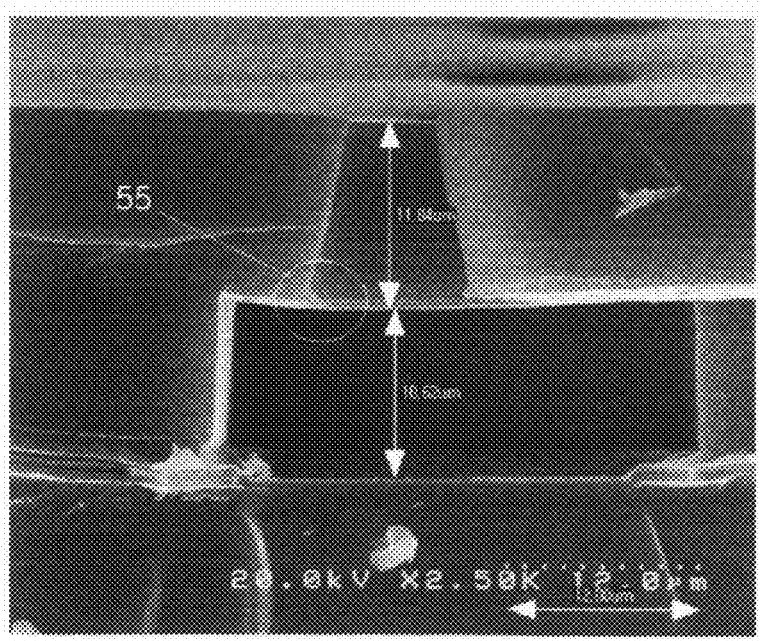

Then, referring to FIG. 2K, a portion of the bottom surface of the substrate 110, which is exposed by the etch mask 171, is etched in order to form a through-hole in the substrate 110, thereby forming an ink feed hole 151. Then, the etch mask 171 is removed. In an exemplary embodiment, such etching on the bottom surface of the substrate 110 may be performed using a dry etching method using plasma. In an alternative exemplary embodiment, such etching on the bottom surface of the substrate 110 may be performed using a wet etching method using tetramethyl ammonium hydroxide (TMAH) or KOH as an etchant. However, the present general inventive concept is not limited thereto. Finally, the sacrificial layer S is removed using a solvent so that an ink chamber 153 surrounded by the channel forming layer 120 and a restrictor 152 is formed, and the electrode 342 for supplying a current to the heater 141 is exposed. Therefore, the manufacture of the inkjet printhead, as illustrated in FIG. 2L, is complete.

An inkjet printhead manufactured using methods according to exemplary embodiments of the present general inventive concept, as described above, do not include a reaction layer at a lower end of a nozzle layer since a composition for forming a sacrificial layer and a composition for forming the nozzle layer have different polarities.

According to another exemplary embodiment, the present general inventive concept provides a positive photoresist composition or a non-photosensitive soluble polymer composition, which includes a prepolymer, having a bisphenol-A based backbone, represented by Formula 1, and a solvent:

<Formula 1>

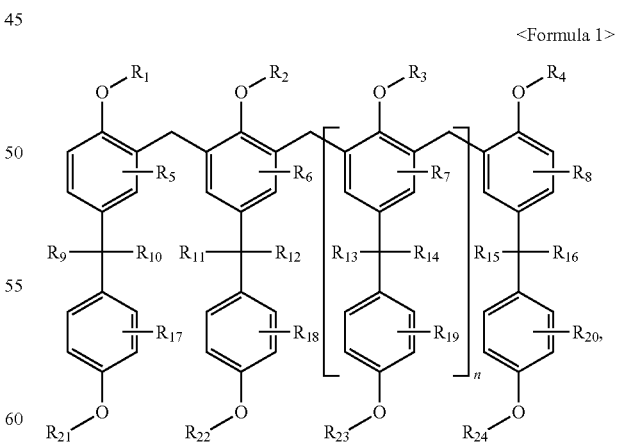

where n is an integer ranging from 2 to 10, and $R_1$ to $R_{24}$ are each independently a halogen atom, a carboxyl group, an amino group, a nitro group, a cyano group, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_7$-$C_{30}$ heteroarylalkyl group.

In an exemplary embodiment, the prepolymer may be a polar prepolymer or a non-polar prepolymer according to a polarity of a substituent, and may be suitably used according to a desired application.

Specifically, the prepolymer may be represented by Formula 2:

<Formula 2>

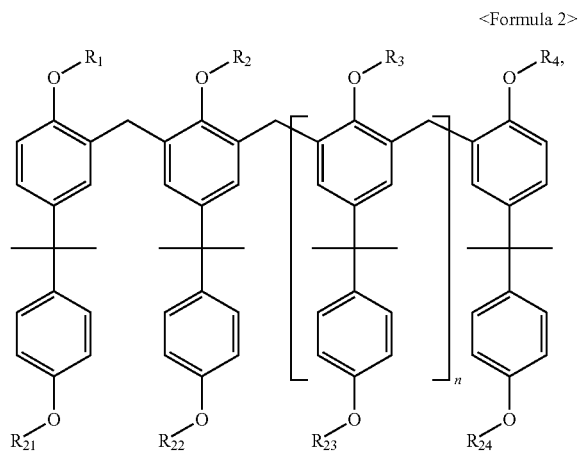

where n is an integer ranging from 2 to 10, and $R_1$ to $R_4$ and $R_{21}$ to $R_{24}$ are each independently a $C_1$-$C_{20}$ alkyl group, or a $C_1$-$C_{20}$ alkyl group substituted with a halogen atom.

In exemplary embodiments, the $C_1$-$C_{20}$ alkyl group may be a linear or branched alkyl $C_1$-$C_{20}$ group, specifically, a linear or branched $C_1$-$C_{12}$ alkyl group, and more specifically a linear or branched $C_1$-$C_6$ alkyl group. In exemplary embodiments, such an alkyl group may be methyl, ethyl, n-propyl, isopropyl, n-butyl, isobutyl, sec-butyl, t-butyl, pentyl, isoamyl, or hexyl. In further exemplary embodiments, one or more hydrogen atoms included in such an alkyl group may be substituted with a halogen atom to form a haloalkyl group. However, the present general inventive concept is not limited thereto.

The $C_2$-$C_{20}$ alkenyl group may be a linear or branched $C_2$-$C_{20}$ aliphatic hydrocarbon having a C—C double bond. In exemplary embodiments, a suitable alkenyl group may include 2 to 12 carbon atoms in its chain, and specifically, 2 to 6 carbon atoms in its chain. The branched $C_2$-$C_{20}$ aliphatic hydrocarbon having a C—C double bond refers to a linear alkenyl chain to which one or more low alkyl or low alkenyl group are attached. In an exemplary embodiment, such an alkenyl group may not be substituted, or may be independently substituted with one or more groups selected from the group consisting of halo, carboxy, hydroxy, formyl, sulfur, sulfino, carbamoyl, amino and imino. However, the substitutent of the alkenyl group may not be limited to these groups. In exemplary embodiments, such an alkenyl group may be ethenyl, prophenyl, carboxyethenyl, carboxyprophenyl, sulfinoethenyl or sulfonoethenyl. However, the present general inventive concept is not limited thereto.

The $C_2$-$C_{20}$ alkynyl group may be a linear or branched $C_2$-$C_{20}$ aliphatic hydrocarbon group having a C—C triple bond. In exemplary embodiments, a suitable alkynyl group may include 2 to 12 carbon atoms in its chain, and specifically, 2 to 6 carbon atoms in its chain. The branched $C_2$-$C_{20}$ aliphatic hydrocarbon group having a C—C triple bond may refer to a linear alkynyl chain to which one or more low alkyl or low alkynyl groups are attached. In exemplary embodiments, such low alkynyl groups may not be substituted, or may be independently substituted with one or more groups selected from the group consisting of halo, carboxy, hydroxy, formyl, sulfur, sulfino, carbamoyl, amino and imino. However, the present general inventive concept is not limited thereto.

The $C_1$-$C_{20}$ heteroalkyl group refers to an alkyl group in which a linear chain of 1-20 carbons, specifically of 1-12 carbons, and more specifically, of 1-6 carbons includes a hetero atom, such as nitrogen N, oxygen O, phosphorus P, or sulfur S.

The $C_6$-$C_{30}$ aryl group refers to a $C_6$-$C_{30}$ carbocyclic aromatic system having only one ring or a combination of the rings. In exemplary embodiments, the rings may be attached using a pendent method or may be fused together. The terminology "aryl" means an aromatic radical, such as phenyl, naphthyl, tetrahydronaphthyl, indan, or biphenyl. For example, in an exemplary embodiment, the aryl is phenyl. In exemplary embodiments, the aryl group may have one to three substituents selected from the group consisting of hydroxy, halo, haloalkyl, nitro, cyano, alkoxy, and low alkylamino.

The $C_7$-$C_{30}$ arylalkyl group refers to an alkyl group that has one or more hydrogen atoms substituted with the aryl group.

The $C_5$-$C_{30}$ heteroaryl group refers to a monovalent monocyclic or the non-cyclic aromatic radical group having 5-30 ring atoms which consist of one, two, or three hetero atoms selected from N, O, and S, and carbons. In addition, the terminology refers to a monovalent cyclic or the non-cyclic aromatic radical which forms, for example, N-oxide or a quaternary salt through oxidation or quanternization of a hetero atom in its chain. For example, examples of the $C_5$-$C_{30}$ heteroaryl group may include thienyl, benzothienyl, pyridyl, pyrazinyl, pyrimidinyl, pyridazinyl, quinolinyl, quinoxalinyl, imidazolyl, puranyl, benzopuranyl, thiazolyl, isoxazoline, benzisoxazoline, benzimidazolyl, triazolyl, pyrazolyl, pyrrolyl, indolyl, 2-pyridonyl, N-alkyl-2-pyridonyl, pyrazinonyl, pyridazinonyl, pyrimidinonyl, oxazolonyl, N-oxdies corresponding thereto, such as pyridyl N-oxide, quinolinyl N-oxide, and a quaternary salt thereof. However, the $C_5$-$C_{30}$ heteroaryl group of the present general inventive concept is not limited thereto.

The $C_7$-$C_{30}$ heteroarylalkyl group refers to a group made by substituting one or more hydrogen atoms of the defined alkyl group with the defined heteroaryl group. For example, the $C_7$-$C_{30}$ heteroarylalkyl group may refer to a $C_3$ to $C_{30}$ carbocycle aromatic system.

A substituent of the $C_1$-$C_{20}$ alkyl group, the $C_2$-$C_{20}$ alkenyl group, the $C_2$-$C_{20}$ alkynyl group, $C_1$-$C_{20}$ heteroalkyl group, the $C_6$-$C_{30}$ aryl group, the $C_7$-$C_{30}$ arylalkyl group, $C_5$-$C_{30}$ heteroaryl group, and the $C_3$-$C_{30}$ heteroarylalkyl group may be each independently a halogen atom, a carboxyl group, an amino group, a nitro group, or a cyano group.

According to another exemplary embodiment of the present general inventive concept, the non-photosensitive soluble polymer composition may include a solvent in an amount of about 30 to about 500 parts by weight based on 100 parts by weight of the prepolymer, having a bisphenol-A based backbone, represented by Formula 1. When the amount of the solvent is less than about 30 parts by weight, the viscosity is too high and the processability may be degraded. On the other hand, when the amount of the solvent is more than about 500 parts by weight, the viscosity of the obtained polymer is too low and thus the preparation process should be performed several times and thus the process efficiency may be lowered.

According to another exemplary embodiment of the present general inventive concept, the positive photoresist composition may include about 1 to about 80 parts by weight of a photosensitive compound and about 30 to about 500 parts by weight of a solvent, based on 100 parts by weight of the prepolymer, having a bisphenol-A based backbone, represented by Formula 1. When the amount of the photosensitive compound is less than 1 part by weight, the obtained image may not sufficiently correspond to the pattern. On the other hand, when the amount of the photosensitive compound is greater than 80 parts by weight, the uniformity of a photoresist layer may be degraded and the resolution property may be deteriorated. When the amount of the solvent is less than 30 parts by weight, the viscosity is too high and the processability may be degraded. On the other hand, when the amount of the solvent is more than 500 parts by weight, the viscosity of the obtained polymer is too low and thus the preparation process should be performed several times and thus a process efficiency may be reduced.

In exemplary embodiments, the photosensitive compound may be a photoacid generator (PAG) or quinonediazidesterification products, however the present general inventive concept is not limited thereto. For example, the photosensitive compound may be any photosensitive compound that is conventionally used or known in the art. A description of the solvent has been described above.

The positive photoresist composition or the non-photosensitive soluble polymer composition may include other additives, such as a photo-accelerator, a silane coupling agent, a filler, a viscosity controller, a humidifier, or a photo stabilizer. The amount of such respective additives may be in a range of about 0.1 to about 20 parts by weight based on 100 parts by weight of the prepolymer having a bisphenol-A based backbone.

According to another exemplary embodiment of the present general inventive concept, the negative photoresist composition may include about 1 to about 10 parts by weight of a photo initiator and about 30 to about 300 parts by weight of a solvent, based on 100 parts by weight of the polymer. However, the amounts of the photo initiator and solvent may not be limited to such ranges and may be appropriately determined.

The polymer may be an acrylate-based resin, but is not limited thereto. For example, the polymer may be any resin that is used in a negative photoresist or conventionally known in the art. For example, the polymer may be phenol resin, poly urethane resin, epoxy resin, poly imide resin, poly amide resin, urea resin, melamine resin, silicon resin and/or a mixture thereof.

The photo initiator may be any material that generates an ion or a free radical that initiates a polymerization reaction when exposed to light. For example, such a material may be an aromatic halonium or a sulfonium salt of Group VA or VI elements, such as UVI-6974 produced by Union Carbide Co. or SP-172 produced by Asahi denka. The solvent may be the same as the solvent used in the positive photoresist composition.

The present general inventive concept will now be described in further detail with reference to the following examples. These examples are for illustrative purposes only and are therefore not intended to limit the scope of the present general inventive concept.

Synthesis Example 1

Synthesis of Toluene-4-sulfonic Acid Methyl Ester

Toluene-4-sulfonic acid methyl ester as represented by Formula 13 was synthesized according to Reaction Scheme 1.

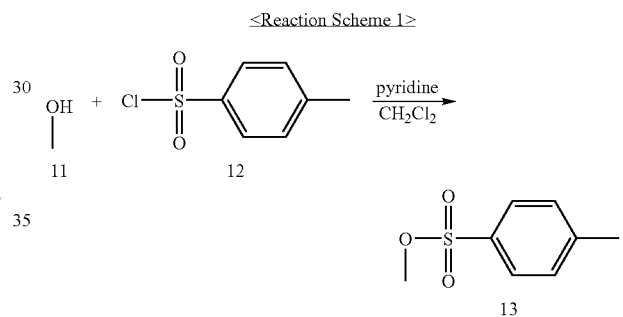

Synthesis Example 2

Synthesis of Compound Represented by Formula 3

A compound, having a bisphenol-A based backbone, represented by Formula 3 was synthesized according to Reaction Scheme 2.

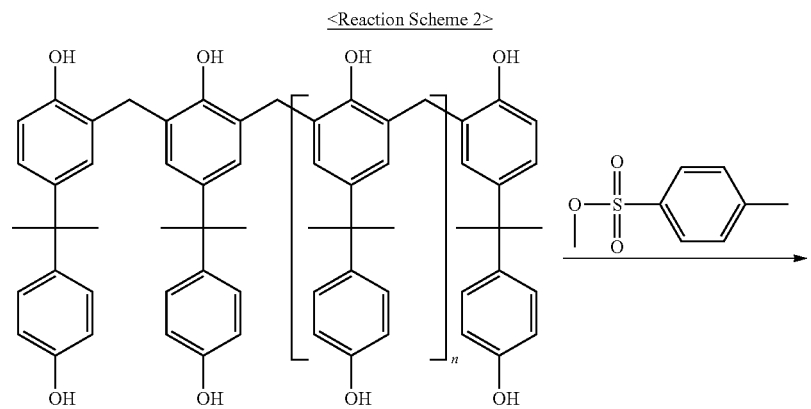

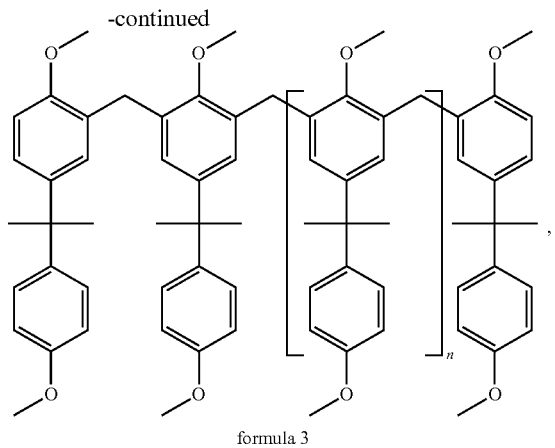

formula 3 where n is an integer ranging from 2 to 4.

Preparation Example 1

Preparation of Negative Photoresist Composition Including Polar Solvent 30 g of cyclopentanone and 1 g of SP-172, produced by Asahi Denka Korea Chemical Co., were added to a jar to prepare a photoresist solution, and then 35 g of an epoxy resin (EPON SU-8 RESIN, FROM HEXION) was added to the jar. The resultant mixture was mixed using a roller for about 24 hours in order to prepare a negative photoresist composition.

Preparation Example 2

Preparation of Negative Photoresist Composition Including Non-polar Solvent

A negative photoresist composition was prepared in the same manner as in Preparation Example 1 except that xylene was used as the solvent instead of cyclopentanone.

Preparation Example 3

Preparation of Positive Photoresist Composition Including Non-polar Solvent and Non-polar Prepolymer 30 g of xylene and 1 g of SP-172, produced by Asahi Denka Korea Chemical Co., were added to a jar to prepare a photoresist solution, and 35 g of prepolymer having a bisphenol-A based backbone substituted with a methyl group at its terminal and prepared according to Synthesis Example 2, was added to the jar. The resultant mixture was mixed using a roller for about 24 hours in order to prepare a positive photoresist composition.

Preparation Example 4

Preparation of Positive Photoresist Composition Including Polar Solvent and Polar Prepolymer A positive photoresist composition was prepared in the same manner as in Preparation Example 3 except that cyclopentanone was used instead of xylene and ODUR 1010A TOK was used instead of the prepolymer prepared according to Synthesis Example 2.

Preparation Example 5

Preparation of Non-photosensitive Soluble Polymer Composition Including Non-polar Solvent and Non-polar Prepolymer 30 g of xylene was added to a jar to prepare a photoresist solution, and then 35 g of prepolymer having a bisphenol-A based backbone substituted with a methyl group at its terminal and prepared according to Synthesis Example 2 was added to the jar. The resultant mixture was mixed using a roller for about 24 hours in order to prepare a non-photosensitive soluble polymer composition.

Example 1

A tantalum nitride heater pattern 141 having a thickness of about 500 Å and an electrode pattern 142 formed of an AlSiCu alloy (Si and Cu each in an amount of 1 wt. % or less) having a thickness of about 500 Å were formed on a 6-inch silicon wafer 110 using a conventional sputtering process and a photolithography process (see FIG. 2A.)

Then, as illustrated in FIG. 2B, the negative photoresist composition prepared according to Preparation Example 1 was spin coated on the surface of the silicon wafer 110 on which the tantalum nitride heater pattern 141 and the electrode pattern 142 are formed, with a rotation speed of 2000 rpm for 40 seconds, and then baked at 95° C. for 7 minutes to form a first negative photoresist layer 141 having a thickness of about 10 μm. Then, as illustrated in FIG. 2C, the first negative photoresist layer 141 was exposed to i-line UV light using a first photomask 161 having a predetermined ink chamber pattern and a restrictor pattern. In this regard, the amount of the i-line UV light was adjusted to 130 mJ/cm² during the exposure. The resultant wafer was baked at 95° C. for 3 minutes, dipped in a PGMEA developer for one minute, and then rinsed with isopropanol for 20 seconds. As a result, a channel forming layer 120 was completely formed (refer to FIG. 2D.) Then, as illustrated in FIG. 2E, the positive photoresist composition prepared according to Preparation Example 3 was spin-coated on the entire surface of the wafer on which the channel forming layer 120 was formed, with a rotation speed of 1000 rpm for 40 seconds, and then baked at about 140° C. for 10 minutes to form a sacrificial layer S. The formation of the sacrificial layer S was controlled such that a thickness of a portion of the sacrificial layer S on the channel forming layer 120 is about 5 μm.

Then, a CMP process was performed to planarize top surfaces of the channel forming layer 120 and the sacrificial layer S, as illustrated in FIG. 2F. Specifically, the resultant wafer was provided to a polishing pad such that the sacrificial layer S faced the polishing pad of a polishing plate (manufacturer: JSR, Product No. JSR FP 8000.) Then, the wafer on the polishing pad was pressed by applying a pressure of 10 to 15 kPa to a backing pad by a press head. While a polishing slurry (FUJIMI Corporation, POLIPLA 103) was being fed onto the polishing pad, the press head was rotated with respect to the polishing pad at a speed of 40 rpm. The backing pad was formed of a material having a Shore D hardness of 30 to 70. The sacrificial layer S was removed at an etch rate of 5 to 7 µm/min until a top portion of the channel forming layer 120 is removed by about 1 µm, so as to planarize the channel forming layer 120. The negative photoresist composition prepared according to Preparation Example 1 and a second photomask 163 were used to form a nozzle layer pattern 130 on the silicon wafer 110 on which the channel forming layer 120 and the sacrificial layer S were formed in the same condition as in when the channel forming layer 120 was formed (see FIGS. 2G, 2H, and 2I.)

As illustrated in FIG. 2J, an etch mask 171 was formed on a bottom surface of the silicon wafer 110 using a conventional photolithography method of forming form an ink feed hole 151. Then, as illustrated in FIG. 2K, a portion of the bottom surface of the silicon wafer 110, which is exposed by the etch mask 171, was etched by plasma etching to form the ink feed hole 151, and then the etch mask 171 was removed. In this regard, the power of a plasma etching apparatus used was 2000 Watts, an etch gas was a gaseous mixture of $SF_6$ and $O_2$ in a mixture ratio of 10:1, and an etch speed applied to the silicon wafer 110 was 3.7 µm/min. Finally, the silicon wafer 110 was dipped in a polar-based solvent, such as a fill-up material, in order to remove the sacrificial layer S and thereby forming an ink chamber 153 and a restrictor 152 as defined by the channel forming layer 120. Therefore, an inkjet printhead having a structure as illustrated in FIG. 2L was completely manufactured.

Figure 4A:
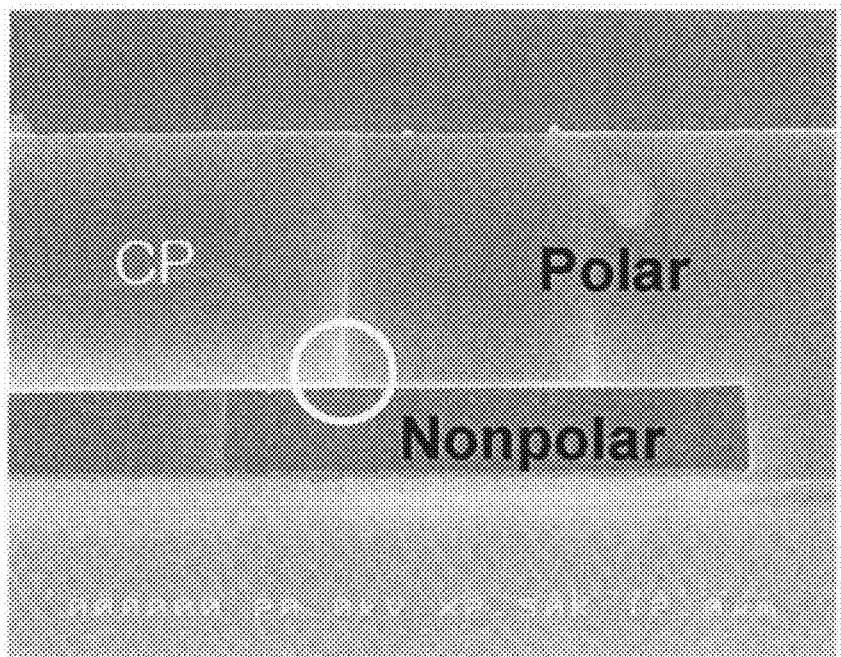
FIGS. 4A and 4B illustrate SEM images of a nozzle layer of an inkjet printhead according to an exemplary embodiment of the present general inventive concept.

An SEM image of a cross-section of the nozzle layer 130 of the inkjet printhead is illustrated in FIG. 4A.

Example 2

An inkjet printhead was manufactured in the same manner as in Example 1, except that the negative photoresist composition prepared according to Preparation Example 2 was used as first and second negative photoresist compositions and the positive photoresist composition prepared according to Preparation Example 4 was used as a positive photoresist composition.

Figure 4B:
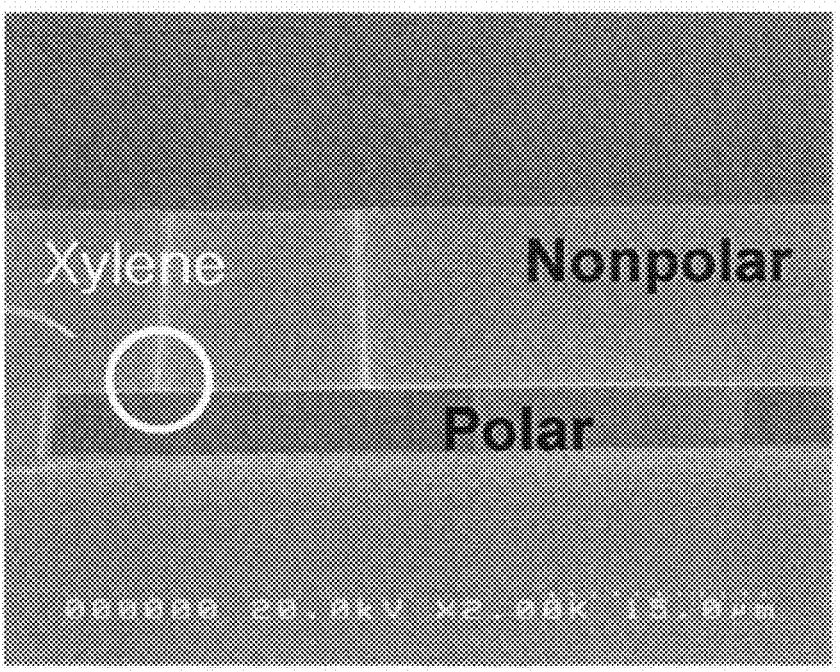

A SEM image of a cross-section of a nozzle layer of the inkjet printhead is illustrated in FIG. 4B.

Example 3

An inkjet printhead was manufactured in the same manner as in Example 1, except that the negative photoresist composition prepared according to Preparation Example 2 was used as first and second negative photoresist compositions and the positive photoresist composition prepared according to Preparation Example 5 was used as a positive photoresist composition. The manufactured inkjet printhead was identified using an electronic microscope and it was found that a reaction layer was not formed at a bottom of a nozzle layer.

As illustrated in FIGS. 4A and 4B, in each of the inkjet printheads manufactured using a method according to an exemplary embodiment of the present general inventive concept, a reaction layer is not formed at a bottom of the nozzle layer.

While the present general inventive concept has been particularly shown and described with reference to exemplary embodiments thereof, it will be understood by one of ordinary skill in the art that various changes in form and details may be made therein without departing from the spirit and scope of the present general inventive concept as defined by the following claims.

What is claimed is:

1. A method of manufacturing an inkjet printhead, the method comprising:
   forming a sacrificial layer with in a positive photoresist composition or a non-photosensitive soluble polymer composition including a first solvent; and
   forming at least one of a channel forming layer and a nozzle layer with a negative photoresist composition including a second solvent having a different polarity from the first solvent included in the positive photoresist composition or in the non-photosensitive soluble polymer composition,
   wherein the first solvent included in the positive photoresist composition or in the non-photosensitive soluble polymer composition has a lower polarity than the second solvent included in the negative photoresist composition.

2. The method of claim 1, wherein a resin included in the positive photoresist composition or in the non-photosensitive soluble polymer composition has a different polarity from a resin included in the negative photoresist composition.

3. The method of claim 1, wherein a difference between dipole moments of the first solvent included in the positive photoresist composition or in the non-photosensitive soluble polymer composition and dipole moments of the second solvent included in the negative photoresist composition that is used to form at least one of the channel forming layer and the nozzle layer is about 1.5 Debye or more.

4. The method of claim 1, wherein a dipole moment of the first solvent included in the positive photoresist composition or in the non-photosensitive soluble polymer composition is about 1 Debye or less.

5. The method of claim 1, wherein a dipole moment of the second solvent included in the negative photoresist composition is about 2.5 Debye or more.

6. The method of claim 1, wherein a resin included in the positive photoresist composition or in the non-photosensitive soluble polymer composition has a lower polarity than a resin included in the negative photoresist composition.

7. The method of claim 1, wherein a resin included in the positive photoresist composition or in the non-photosensitive soluble polymer composition is a prepolymer, having a bisphenol-A based backbone, represented by Formula 1a:

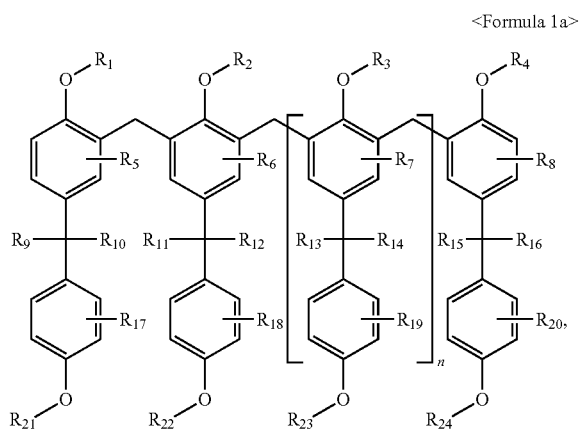

<Formula 1a> where n is an integer ranging from 2 to 10, and
$R_1$ to $R_{24}$ are each independently a $C_1$-$C_{20}$ alkyl group, a $C_2$-$C_{20}$ alkenyl group, a $C_2$-$C_{20}$ alkynyl group, a $C_6$-$C_{30}$ aryl group, or a $C_1$-$C_{30}$ arylalkyl group.

8. The method of claim 1, wherein a resin included in the positive photoresist composition or in the non-photosensitive soluble polymer composition is a prepolymer, having a bisphenol-A based backbone, represented by Formula 2a:

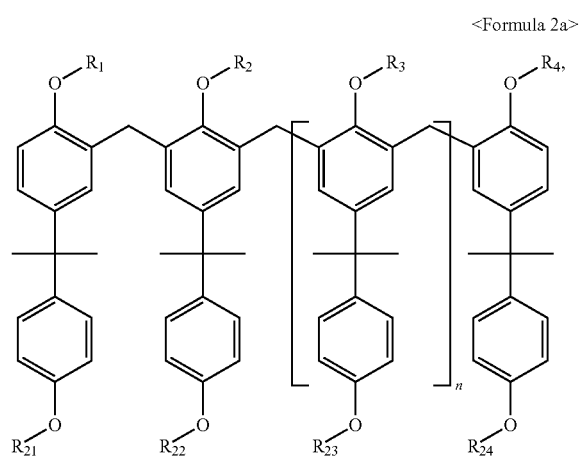

<Formula 2a> where n is an integer ranging from 2 to 10, and
$R_1$ to $R_4$ and $R_{21}$ to $R_{24}$ are each independently a $C_1$-$C_{20}$ alkyl group.

9. The method of claim 1, wherein the first solvent included in the positive photoresist composition or in the non-photosensitive soluble polymer composition comprises one or more compounds selected from the group consisting of gamma-butyrolactone, propylene glycol methyl ethyl acetate, tetrahydrofurane, methyl ethyl ketone, methyl isobutyl ketone, cyclopentanone and xylene.

10. The method of claim 1, wherein a resin included in the negative photoresist composition is an epoxy-based resin.

11. The method of claim 1, comprising:
disposing a heater for heating an ink and an electrode for supplying a current to the heater on a substrate;
disposing the channel forming layer which defines an ink channel by coating a first negative photoresist composition on the substrate on which the heater and the electrode are disposed and then patterning the coated composition using a photolithography process;
disposing the sacrificial layer by coating a positive photoresist composition or a non-photosensitive soluble polymer composition on the substrate on which the channel forming layer is disposed such that the coated composition completely covers the channel forming layer;
planarizing top surfaces of the channel forming layer and the sacrificial layer using a polishing process;
disposing the nozzle layer having a nozzle by coating a second negative photoresist composition on the channel forming layer and the sacrificial layer and patterning the coated composition using a photolithography process;
forming an ink feed hole in the substrate; and
removing the sacrificial layer.

12. The method of claim 11, wherein the polishing process is a chemical mechanical polishing (CMP) process.

13. A method of manufacturing an inkjet printhead, the method comprising:
forming a sacrificial layer with a positive photoresist composition or a non-photosensitive soluble polymer composition including a first solvent; and
forming at least one of a channel forming layer and a nozzle layer with a negative photoresist composition including a second solvent having a different polarity from the first solvent included in the positive photoresist composition or in the non-photosensitive soluble polymer composition,
wherein the first solvent included in the positive photoresist composition or in the non-photosensitive soluble polymer composition has a higher polarity than the second solvent included in the negative photoresist composition, and
wherein a resin included in the positive photoresist composition or in the non-photosensitive soluble polymer composition is a prepolymer, having a bisphenol-A based backbone, represented by Formula 1b:

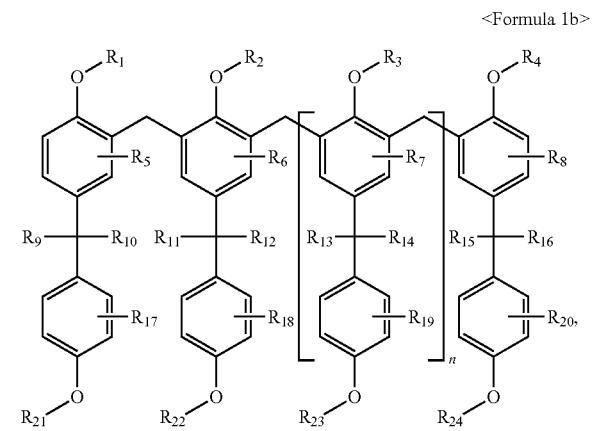

<Formula 1b> where n is an integer ranging from 2 to 10, and
$R_1$ to $R_{24}$ are each independently a halogen atom; a carboxyl group; an amino group; a nitro group; a cyano group; a $C_1$-$C_{20}$ alkyl group substituted with a halogen atom, a carboxyl group, an amino group, a nitro group, or a cyano group; a $C_2$-$C_{20}$ alkenyl group substituted with a halogen atom, a carboxyl group, an amino group, a nitro group, or a cyano group; a $C_2$-$C_{20}$ alkynyl group substituted with a halogen atom, a carboxyl group, an amino group, a nitro group, or a cyano group; a $C_1$-$C_{20}$ heteroalkyl group substituted with a halogen atom, a carboxyl group, an amino group, a nitro group, or a cyano group, or unsubstituted $C_1$-$C_{20}$ heteroalkyl group; a $C_6$-$C_{30}$ aryl group substituted with a halogen atom, a carboxyl group, an amino group, a nitro group, or a cyano group; a $C_7$-$C_{30}$ arylalkyl group substituted with a halogen atom, a carboxyl group, an amino group, a nitro group, or a cyano group; a $C_5$-$C_{30}$ heteroaryl group substituted with a halogen atom, a carboxyl group, an amino group, a nitro group, or a cyano group, or an unsubstituted $C_5$-$C_{30}$ heteroaryl group; or a $C_7$-$C_{30}$ heteroarylalkyl group substituted with a halogen atom, a carboxyl group, an amino group, a nitro group, or a cyano group, or an unsubstituted $C_7$-$C_{30}$ heteroarylalkyl group.

14. The method of claim 13, wherein a dipole moment of the first solvent included in the positive photoresist composition or the non-photosensitive soluble polymer composition is about 2.5 Debye or more.

15. The method of claim 13, wherein a dipole moment of the second solvent included in the negative photoresist composition is about 1 Debye or less.

16. The method of claim 13, wherein a resin included in the positive photoresist composition or in the non-photosensitive soluble polymer composition has higher polarity than a resin included in the negative photoresist composition.

17. A method of manufacturing an inkjet printhead, the method comprising:
  forming a sacrificial layer with a positive photoresist composition or a non-photosensitive soluble polymer composition including a first solvent; and
  forming at least one of a channel forming layer and a nozzle layer with a negative photoresist composition including a second solvent having a different polarity from the first solvent included in the positive photoresist composition or in the non-photosensitive soluble polymer composition, wherein the first solvent included in the positive photoresist composition or in the non-photosensitive soluble polymer composition has a higher polarity than the second solvent included in the negative photoresist composition, and wherein a resin included in the positive photoresist composition or in the non-photosensitive soluble polymer composition is a prepolymer, having a bisphenol-A based backbone, represented by Formula 2b:

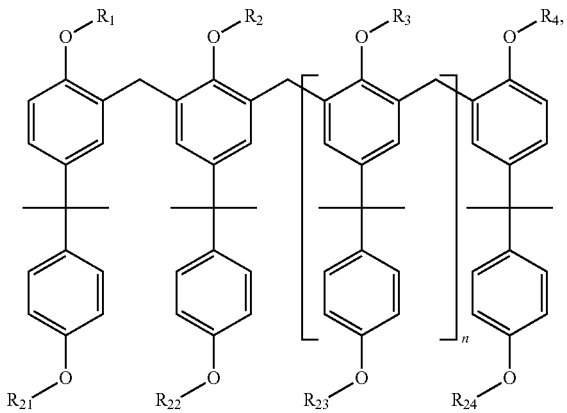

<Formula 2b> where n is an integer ranging from 2 to 10, and
$R_1$ to $R_4$ and $R_{21}$ to $R_{24}$ are each independently a $C_1$-$C_{20}$ alkyl group substituted with a halogen atom.

* * * * *